United States Patent [19]
Kondou et al.

[11] Patent Number: 5,923,956
[45] Date of Patent: Jul. 13, 1999

[54] METHOD OF SECURING A SEMICONDUCTOR CHIP ON A BASE PLATE AND STRUCTURE THEREOF

[75] Inventors: Yuji Kondou; Akihiro Yano, both of Tokyo, Japan

[73] Assignee: NEC Corporation, Tokyo, Japan

[21] Appl. No.: 08/790,469

[22] Filed: Jan. 29, 1997

[30] Foreign Application Priority Data

Jan. 30, 1996 [JP] Japan ................................ 8-014059

[51] Int. Cl.⁶ .................... H01L 21/44; H01L 21/48; H01L 21/50
[52] U.S. Cl. .................... 438/118; 438/106; 438/119; 438/123
[58] Field of Search ................... 438/118, 20, 106, 438/119, 123

[56] References Cited

U.S. PATENT DOCUMENTS

| | | | |
|---|---|---|---|
| 4,806,818 | 2/1989 | van Esdonk et al. | 438/106 |
| 5,175,060 | 12/1992 | Enomoto et al. | 438/118 |
| 5,187,123 | 2/1993 | Yoshida et al. | 438/119 |
| 5,194,695 | 3/1993 | Maslakow | 438/123 |
| 5,211,707 | 5/1993 | Ditchek et al. | 438/20 |
| 5,229,331 | 7/1993 | Doan et al. | 438/20 |
| 5,338,704 | 8/1994 | Imai et al. | 438/119 |
| 5,455,196 | 10/1995 | Frazier | 438/20 |
| 5,585,301 | 12/1996 | Lee et al. | 438/20 |

FOREIGN PATENT DOCUMENTS

| | | |
|---|---|---|
| 1-108734 | 4/1989 | Japan . |
| 4-221865 | 8/1992 | Japan . |
| 7-21903 | 1/1995 | Japan . |
| 7-161304 | 6/1995 | Japan . |

*Primary Examiner*—Kevin M. Picardat
*Assistant Examiner*—Devon Collins
*Attorney, Agent, or Firm*—Hayes Soloway Hennessey, Grossman & Hage, P.C.

[57] ABSTRACT

A semiconductor chip such as a cold cathode is mounted on a base plate using a conventional solder or like metallic eutectic material or conductive paste, and then secured to the base plate using an inorganic adhesive or like material, which is capable of being hardened at a temperature lower than the mounting temperature, and the bonding strength of which is not deteriorated even at higher temperatures.

9 Claims, 10 Drawing Sheets

(b)

(a)

(b)

(a)

(b)

(a)

(b)

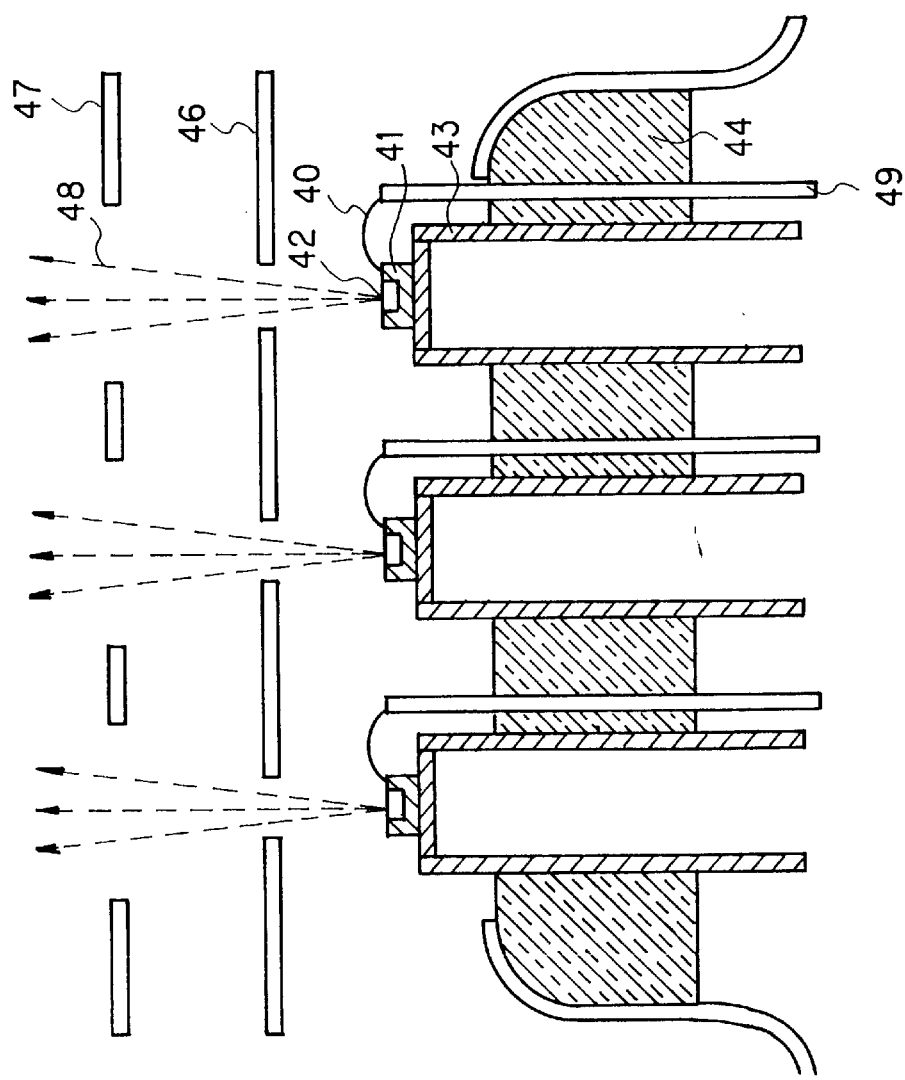

(a)

(b)

(a)

(b)

(a)

(b)

METHOD OF SECURING A SEMICONDUCTOR CHIP ON A BASE PLATE AND STRUCTURE THEREOF

BACKGROUND OF THE INVENTION

The present invention relates to a method of securing a semiconductor chip on a base plate and a structure thereof.

Electric field electron emission cold cathodes, i.e., a field emiiter or a cold cathod have recently been developed as electron sources for electron guns or the like. FIG. 4 is a sectional view showing such an electric field electron emission cathode. Usually, the cold cathode 30 comprises an electron emission area 33 with several hundreds to several tens of thousands of projecting micro-emitters 32 formed in a circular or square array on a semiconductor substrate 31 and a gate electrode 34 formed above the micro-emitters 32 via an insulating layer 35 to apply an intense electric field to the micro-emitters 32.

In this electric field electron emission cold cathode, by applying a voltage between the gate electrode 34 and each micro-emitter 32 an electric field is concentrated at the pointed end of the micro-emitter 32 to cause emission of electrons corresponding to the potential difference between the two electrodes from the micro-emitter 32. The pointed end of the micro-emitter 32 may have a diameter of about 1 $\mu$m, and in this case an application of voltage of 50 to 100 V between each micro-emitter 32 and the gate electrode 34 causes emission of about 1 $\mu$A of electrons from the micro-emitter. An electric field electron emission cold cathode used for a usual cathode-ray tube has several thousands to several tens of thousands of micro-emitters. In this case, the electron emission area has a size of several hundred $\mu$m because each micro-emitter has as small diameter as about 1 $\mu$m.

FIG. 5 is a sectional view showing an electron gun cathode structure with electric field electron emission cold cathodes assembled therein. Each cold cathode 41 is mounted in a sleeve 43, which is secured by an insulator 44 to an outer cathode support 45. Reference numeral 40 designates bonding wires, 42 electron emission areas of the cold cathodes, and 49 connection ports. Reference numeral 46 designates a first grid, and 47 a second grid. The electron emission area 42 of each cold cathode 41 has to be in an accurate position relation to the first grid 46, because this relation determines the characteristics of the electron gun.

Japanese Laid-Open Patent Publication No. 7-161304 discloses a technique concerning a cathode structure using cold cathodes. FIG. 6(a) is a perspective view showing this cathode structure, and FIG. 6(b) is a sectional view taken along line 6–6'. In this cathode structure 50, each electric field electron cold cathode chip is secured to a cap-like chip holder 52 formed with a window on a top thereof such that its electron emission area 53 is exposed by a window 51 formed in the chip holder 52 and the chip contact area 54 is secured to a back surface edge portion of the window 51. As shown in FIG. 6(b), the chip is pushed against the chip holder 52 by an elastic connecting piece 61. A feature of this prior art structure resides in that the gate electrode of the cold cathode is wired without use of any wire bonding but by pushing the chip against the chip holder.

FIG. 7 shows a cathode-ray tube. Electron beams 78 emitted from the cold cathodes of a cathode structure 71 are converged by an electron lens of an electron gun 72 formed by a first to a sixth grids facing the cathode structure 71 to pass through a shadow mask 73 and impinge upon a phosphor screen 77, thus causing generation of predetermined colors. The phosphor dots of the phosphor screen 77 constituting pixels of various colors have a typical diameter of about 100 $\mu$m. The beam spot formed by each electron beam 78 on the phosphor screen 77 should have such a diameter that it can irradiate a plurality of phosphor cells at a time.

Since a large size cathode-ray tube has a problem of spherical surface aberration at its end surface, tending to increase the electron beam spot size, it is necessary to decrease the spot diameter in size. Therefore, the electron lens assembling accuracy is extremely high, specifically several to 10 $\mu$m. In other words, the assembling accuracy of the electron gun is in a range, can sufficiently allow electron beam convergence fluctuations and fluctuations of the beam spot position on the phosphor screen.

In the electron gun using cold cathodes, it is important to take into account that the focused image on the phosphor cell is a point light source image of the emission area of the cold cathode and the cold cathode mounting position accuracy in a plane perpendicular to the electron beam progress direction is directly reflected on the phosphor cell position accuracy. This means that the cold cathode mounting position should be set highly accurately.

A prior art method of highly accurately mounting cold cathode or like silicon chips or like very small elements will now be described. As shown in FIG. 8, Japanese Laid-Open Patent Publication No. 4-221865 discloses a technique of securing silicon chips or like very small element. This technique permits mounting and securing a plurality of very small elements automatically without need of positioning each element. Specifically, a coating material having satisfactory wetting property with respect to a solder material 84, is coated on the upper surface of a raised portion 82 of a base plate 81 and also on the lower surface of a very small element 83, and then the very small element 83 is set on the raised portion 82 via the solder material 84. By fusing the solder material 84 in this state by means of heating, the very small element 83 and the raised portion 82 pull each other due to the surface tension in the solder material 84. As a result, the very small element 83 is soldered to a predetermined position. In this technique, the final position of the very small element 83 is highly accurately determined absolutely by the shapes and sizes of the raised portion 82 and the very small element 83 and the surface distribution of the surface tension of the solder material 84 over the raised portion 82 and the very small element 83.

As shown in FIGS. 9(a) and 9(b), Japanese Laid-Open Patent Publication No. 1-108834 discloses a technique of preventing flux and gases contained in the solder from flowing out to portions where wires are secured to avoid deterioration of the mechanical strength, electric properties and thermal stability of these parts. Specifically, a metal base 91 has holes 92, in which leads 96 are secured by an insulating material 93. The leads 96 are connected to a printed wiring board 94 using a solder material 97. The flux and gases contained in the solder material have adverse effects on a chip 95 and bonding wires 98. Accordingly, a bank 99 is provided to prevent the flow-out of the flux to the chip 95 and bonding wires 98. As shown in FIGS. 10(a) and 10(b), it is further well known in the art to provide protuberances to engage with an element for the positioning thereof. Specifically, when securing a chip 102 to a base plate 101, two surfaces of the chip 102 are pushed against protuberances 102 to improve the accuracy of the mounting position.

The present invention seeks to solve the following problems in connection with the construction and method of manufacture of an electron gun using cold cathodes. (1) The cold cathode has to be mounted and secured in a predetermined position with an accuracy of plus and minus several μm. (2) It is necessary, when sealing the electron gun in the cathode-ray tube with glass after the securing of the element, to prevent deterioration of the mounting position accuracy in a high temperature sealing atmosphere (of about 550° C. at the peak) below the softening temperature of the glass.

The dimensional precision of the general silicon chip forming the cold cathod element will now be described as a principle subject. The silicon chip is obtained from a silicon wafer by dicing or like separating method. In the dicing process, the dimensional accuracy of the of outer shape of the chip is at most about several ten μm, and the parallelness of the opposed surfaces is about 180±5 degrees. These parameters are determined by the thickness reduction of the dicing blade used for the dicing as the blade is worn during the dicing of the wafer, as will as the accuracy of the optical microscope or the like used initiual positioning for the dicing, mechanical accuracy of the dicing apparatus and so forth.

In the prior art cases of FIGS. 8 and 10, the dimensional accuracy of the outer shape of the chip is directly reflected on the chip mounting position accuracy. In the prior art case of FIG. 8, in addition to the dimensional accuracy of the chip it is sufficiently predicted that the wetting property of the solder has planar distributions on the side of the substrate and in the back surface. Therefore, it can be hardly thought that the raised portion and the chip center coincide, giving rise to the problem that the mounting position accuracy is deteriorated beyond the outer shape dimensions of the chip.

Gold-silicon eutectic alloys are typical autectic alloys used as the solder for bonding cold cathode elements on cathode structure substrates. The gold-silicon eutectic alloys are fused at about 430° C. When sealing the electron gun in the picture tube, the temperature is raised to about 550° C., which is higher than the melting points of the gold-silicon eutectic alloys. Therefore, even when the cold cathode element is highly accurately mounted at the time of the sealing of the tube with glass, its position accuracy is deteriorated due to its movement caused with the fusing of gold-silicon alloy solder.

A gold—gold thermal press process is a different general chip mounting process. Again in this case, the interface between gold and silicon is alloyed, so that the mounting position accuracy is deteriorated due to fusing of the mounting material at temperatures in the neighborhood of 550° C., the temperature at the time of the sealing of the tube with glass.

Where eutectic alloys with melting points higher than 550° C. are used as the mounting material, the following problems are posed. (1) Silver solder or like material results in great flux and other impurities and is therefore not suited for the mounting of semiconductor chips. (2) Where the melting temperatures are 600° C. and above, the mounting position of the chip is deviated during cooling after the mounting of the chip due to the thermal expansion coefficient difference between the metal base and the chip mounted thereon, thus deteriorating the mounting accuracy. (3) Where the system is heated to a temperature of 600° C. or above, the element may be damaged unless the oxygen concentration in the atmosphere is held low.

SUMMARY OF THE INVENTION

An object of he present invention is therefore to provide a method of securing a semiconductor chip on a base plate capable of securing the semiconductor chip in position without position accuracy deterioration.

In more specifically, the present invention provides a securing the cold cathode in position without position accuracy deterioration. The cold cathode position is not deviated even in a high temperature process of glass sealing an electron gun with cold cathodes in a cathode-ray tube.

According to the present invention, an electron beam emission area of an electric field electron emission cold cathode, which is used for an electron gun or like electron source, is accurately positioned with respect to an electron lens, and this accuracy is maintained in even a high temperature process of sealing the electron gun or the like in a cathode-ray tube or like vacuum tube.

According to one aspect of the present invention, there is provided a securing method of a semiconductor chip on a base plate comprising the steps of: mounting the semiconductor chip on the base plate by using a mounting material, and securing periphery of the semiconductor chip to the base plate by using an inorganic adhesive capable of being hardened at a temperature lower than the hardening temperature of the mounting material used for the mounting.

In the above aspect, at least six points of the periphery of the semiconductor chip are secured to the base plate by using the inorganic adhesive. Further the semiconductor chip is mounted on recess formed on the base plate by using the mounting material.

According to another aspect of the present invention, there is provided a method of securing an electric field electron emission cold cathode comprising an emitter section having a large number of micro-projections of a conductive material formed on a conductive substrate via an insulating film, the electric field electron emission cold cathode being electrically connected to and secured to the conductive base plate, the method comprising the steps of mounting the electric field electron emission cold cathode on the base plate at a predetermined position thereof by using a mounting material, and securing the periphery of the electric field electron emission cold cathode to the conductive base plate by using an inorganic adhesive capable of being hardened at a temperature lower than the hardening temperature of the mounting material used for the mounting.

According to the present invention, there is provided a structure of securing an electric field electron emission cold cathode, wherein the semiconductor chip is mounted on the base plate by using a mounting material, and periphery of the semiconductor chip is secured to the base plate by using an inorganic adhesive capable of being hardened at a temperature lower than the hardening temperature of the mounting material used for the mounting.

According to other aspect of the present invention, there is provided a structure of securing an electric field electron emission cold cathode comprising an emitter section having a large number of micro-projections of a conductive material formed on a semiconductor substrate and a gate section formed above the semiconductor substrate via an insulating film, the securing structure comprising a conductive base plate, the electric field electron emission cold cathode being mounted on the conductive base plate by using a mounting material, the periphery of the electric field electron emission cold cathode being secured to the base plate by using an inorganic adhesive capable of being hardened at a temperature lower than the hardening temperature of the mounting material used for the mounting.

Other objects and features will be clarified from the following description with reference to attached drawings.

BRIEF DESCRIPTION OF THE DRAWINGS

FIG. 5 is a sectional view showing an electron gun cathode structure with electric field electron emission cold cathodes assembled therein;

PREFERRED EMBODIMENTS OF THE INVENTION

Figure 1A:
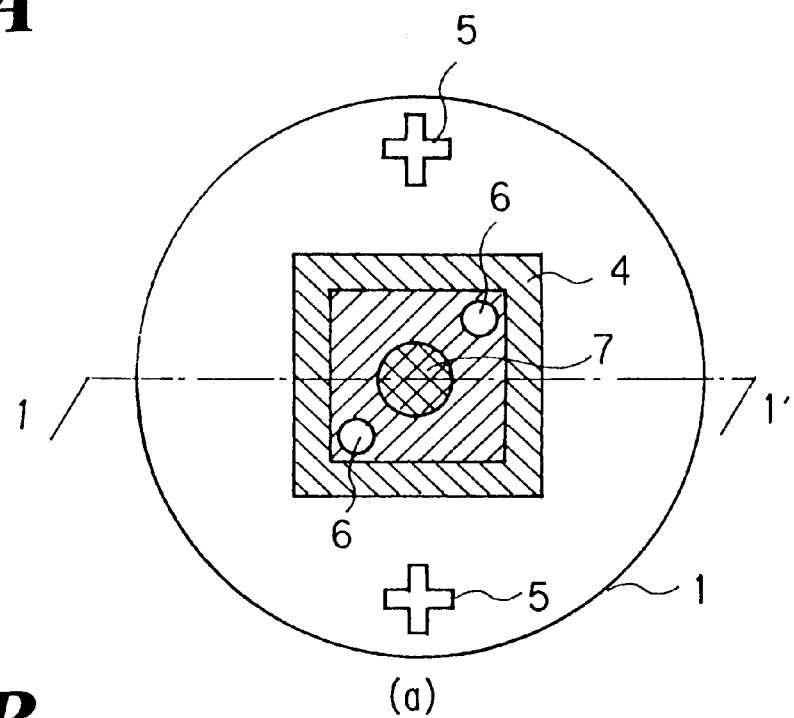
FIGS. 1(*a*) and 1(*b*) are a plan view showing a cathode structure according to a first embodiment of the present invention and a sectional view taken along line 1–1' in FIG. 1(*a*)
Figure 1B:
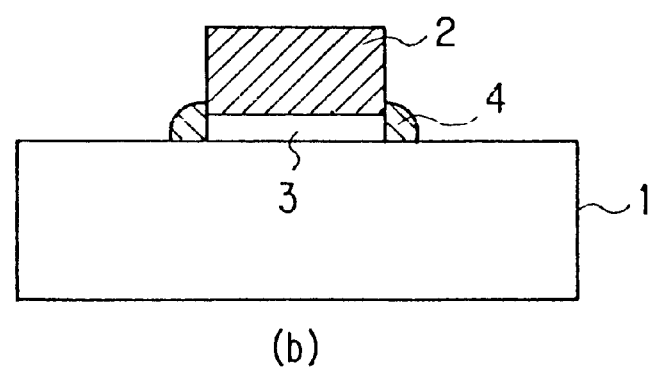

The present invention will now be described with reference to the drawings. FIG. 1(*a*) is a plan view showing a cathode structure according to a first embodiment of the present invention, FIG. 1(*b*) is a sectional view taken along line 1–1' in FIG. 1(*a*). The cathode structure will now be described together with the method of its manufacture and the procedure of its mounting. A base plate 1 of the cathode structure is set in a mounting apparatus, which is provided with a CCD camera for detecting positioning marks and a computer for calculating the mounting position. Two positions of the alignment marks 5 of the base plate 1 are detected and a mounting position thereof is calculated. Then, a positioning pattern of a cold cathode 2 is detected, and the center position thereof is calculated. Then, Then, the cold cathode 2 with a solder material 3 is moved to a predetermined position of the base plate 1 and mounted therein. Particularly, in this embodiment the solder material 3 and the cold cathode 2 are positioned such that the electron emission area is located at a predetermined position of the base pate 1. The base plate 1 and the cold cathode 2 held in this state are then heated to a predetermined temperature. When the solder is a gold/silicon eutectic alloy, it is fused in the neighborhood of 430° C., and in this case the system is heated to the neighborhood of 430° C. After the melting of the gold/silicon eutectic alloy, the base plate 1 and the cold cathode 2 are held for a while. Then, they are cooled down while they are held in this state. After the cooling, an inorganic adhesive 4 is coated around the cold cathode. As the inorganic adhesive may be used, for instance, "AZ-120" manufactured by Semedain Inc. or "Aronceramic D" manufactured by Towa Gosei Kagaku Inc. Then, the base late 1 and the cold cathode 2 are heated up to the hardening temperature (near 150° C.) of the inorganic adhesive 4. After they have been heated, they are cooled down. In the above procedure, the cold cathode 2 is mounted on the cathode structure base plate 1 at a predetermined position thereof.

FIG. 5 shows an application to an electron gun. In this case, a cylindrical metal member called sleeve 43 is used as the cathode structure base plate. The sleeve 43 is secured to an outer cathode support 45 via an insulator 44. In this way, a cathode structure is formed. This cathode structure and a first and a second grids 46 and 47 are assembled together such that they are positioned relative to one another very accurately. The accuracy is, for instance, ±10 $\mu$m or less. A predetermined high accuracy is also necessary with respect to the relative positions of the electron emission area 42 of the cold cathode 41 which emits an electron beam 48 and the first and second grids 46 and 47.

Figure 7:
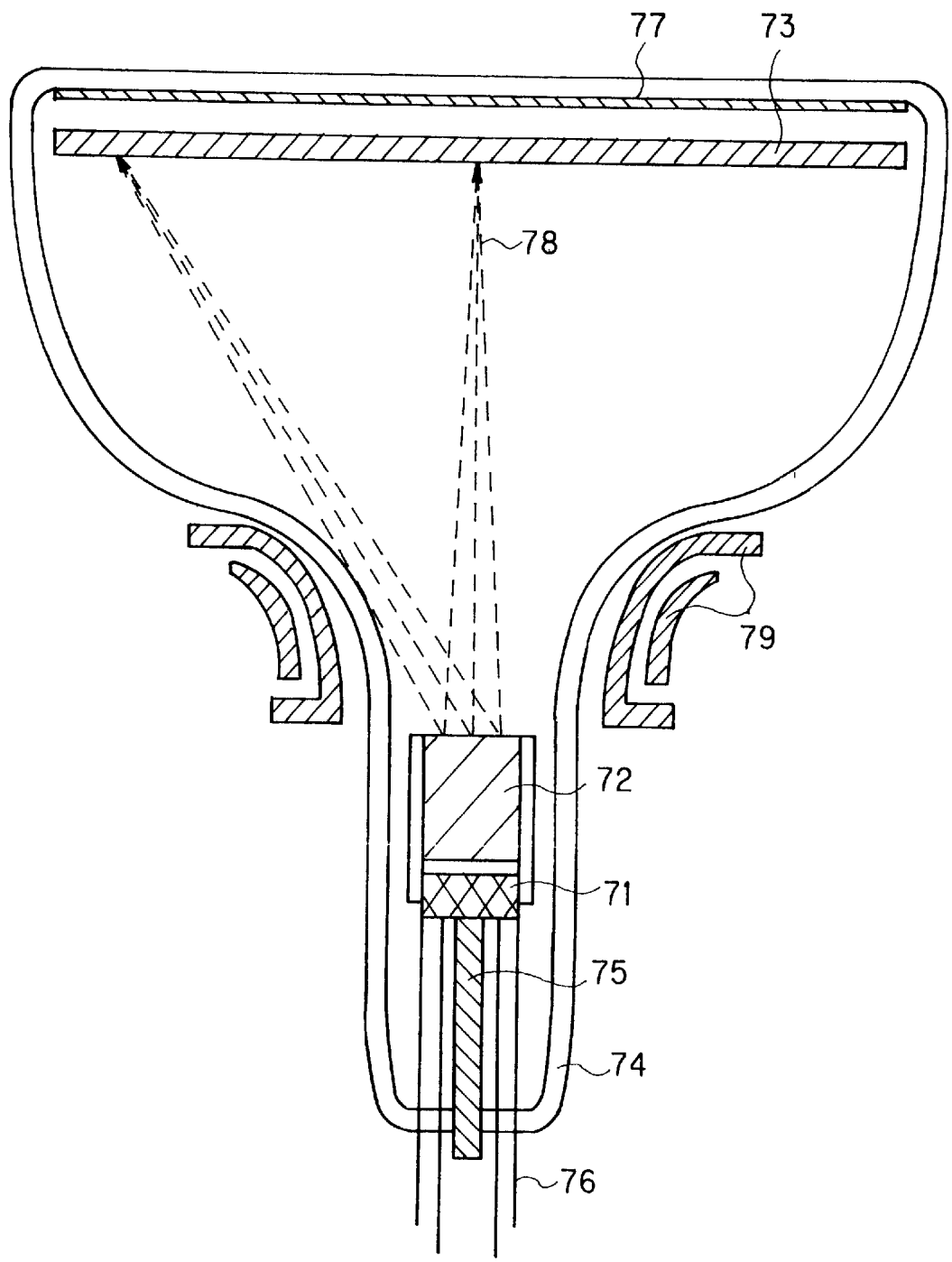
FIG. 7 shows the electron gun which is glass sealed in a cathode-ray tube 74.
Figure 8:
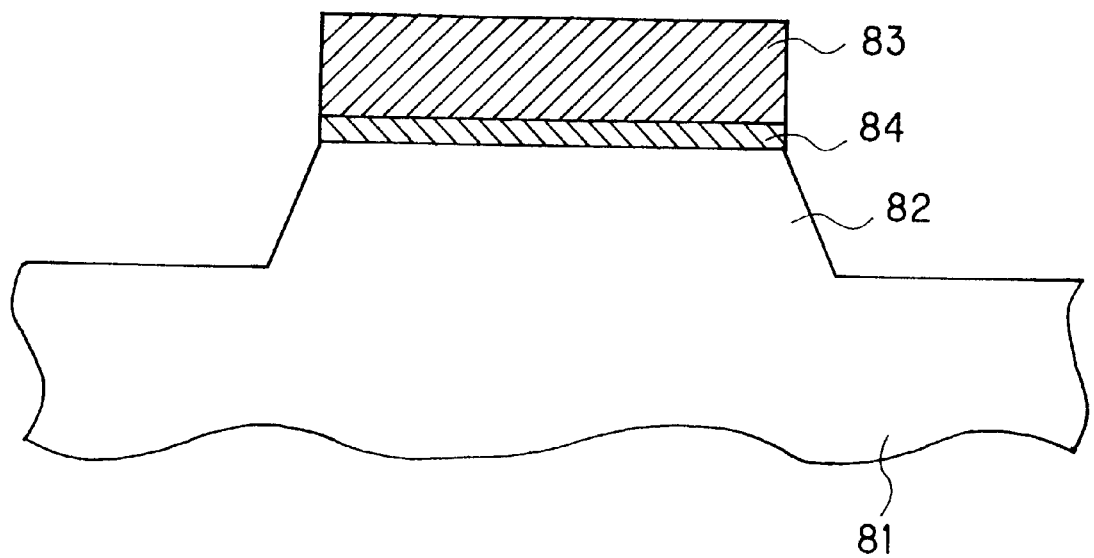
FIG. 8 is a drawing for explaining a prior art method of highly accurately mounting cold cathode or like silicon chips or like very small elements.
Figure 9A:
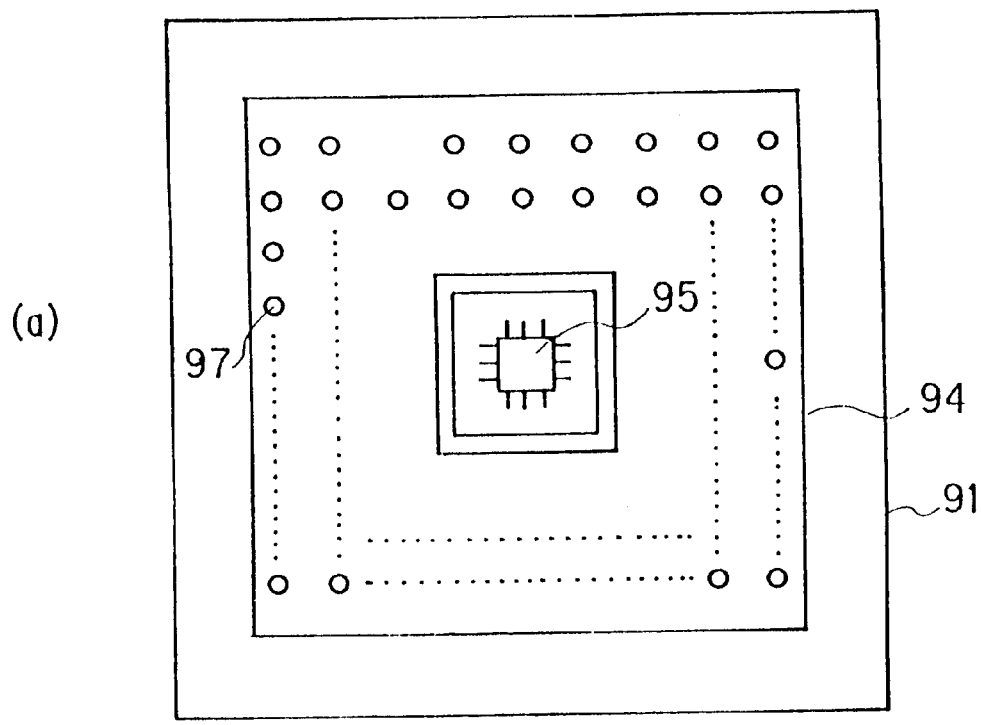
FIGS. 9(*a*) and 9(*b*) show a technique of preventing flux and gases contained in the solder from flowing out to portions where wires are secured to avoid deterioration of the mechanical strength, electric properties and thermal stability of these parts.
Figure 9B:
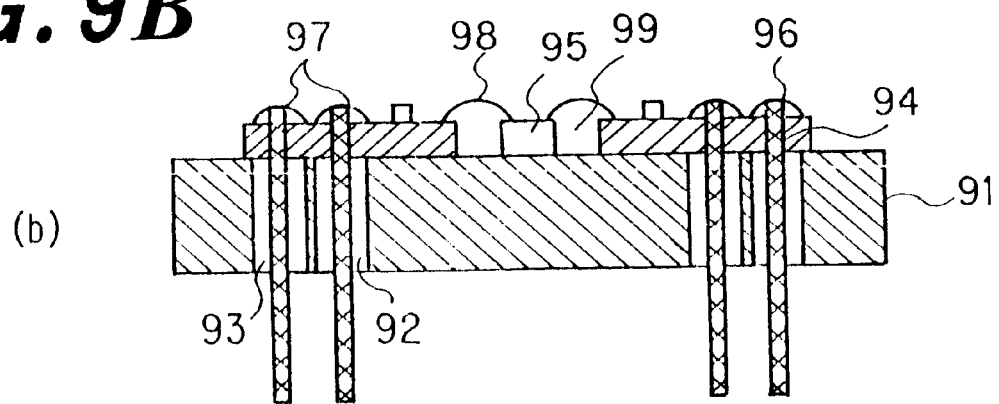
Figure 10A:
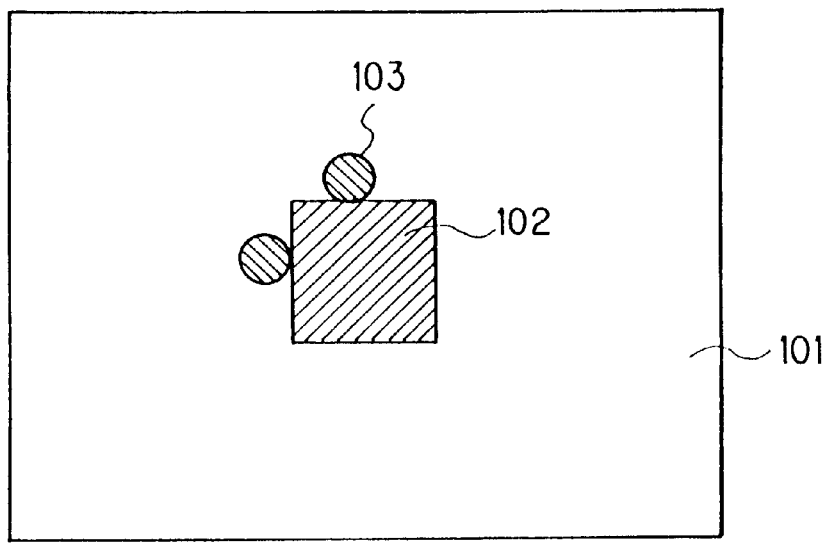
FIGS. 10(*a*) and 10(*b*) are drawings for explaining prior art protuberances to engage with an element for the positioning thereof.
Figure 10B:
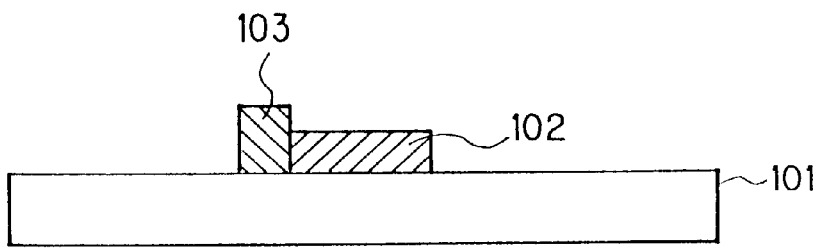

FIG. 7 shows the electron gun which is glass sealed in a cathode-ray tube 74. In this case, since glass has a high melting point of 600° or above, the cathode structure with the cold cathode mounted therein and the neighborhood thereof are elevated in temperature up to about 550° C. In this embodiment, the outer periphery of the cold cathode is secured by the inorganic adhesive, which is not fused but remains hard even when its temperature is increased to about 550° C., causing no deviation of the cold cathode position. After the cathode-ray tube has been sealed, impurity gases inside it are released to the outside through a discharge pipe 75 by heating it at a temperature of about 400° C. for about 2 hours in an exhausting process. After the exhausting, the exhausting pipe 75 is sealed.

Figure 2A:
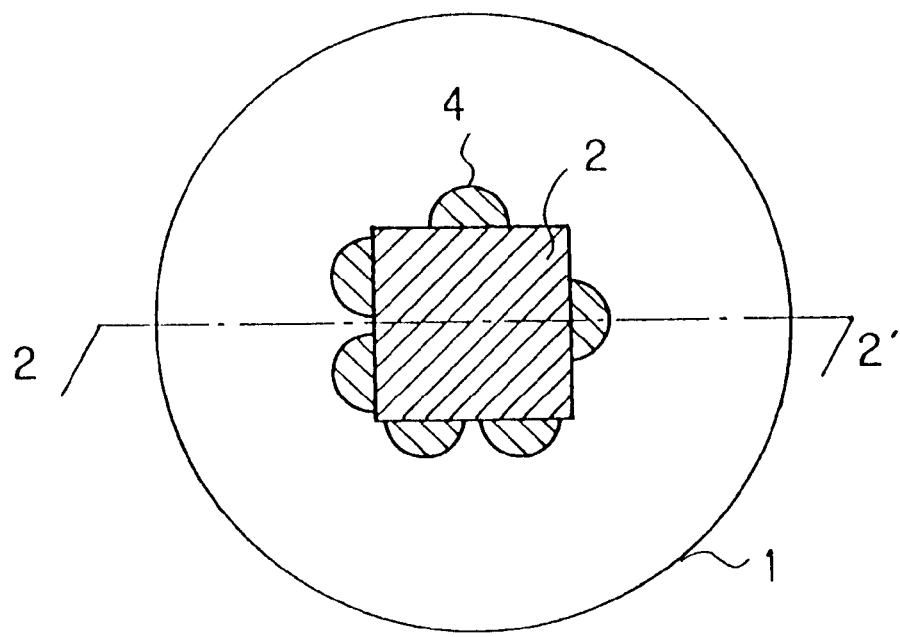
FIGS. 2(*a*) and 2(*b*) are a plan view showing a cold cathode mounted on a cathode structure base plate according to a second embodiment and a sectional view taken along line A–A' in FIG. 2(*a*)
Figure 2B:
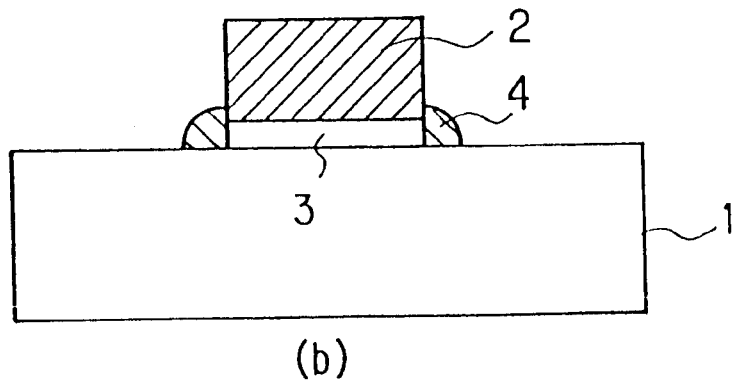

FIGS. 2(*a*) and 2(*b*) show a second embodiment of the present invention. FIG. 2(*a*) is a plan view showing a cold cathode mounted on a cathode structure base plate, and FIG. 2(*b*) is a sectional view taken along line 2–2' in FIG. 2(*a*). In this embodiment, after a cold cathode 2 has been mounted on a cathode structure base plate 1, it is secured by applying an inorganic adhesive 4 intermittently at six or more points. The intermittent application of the inorganic adhesive has an effect of dispersing the strain due to the thermal expansion coefficient differences among silicon, gold and the inorganic adhesive to alleviate damage to silicon.

Figure 3A:
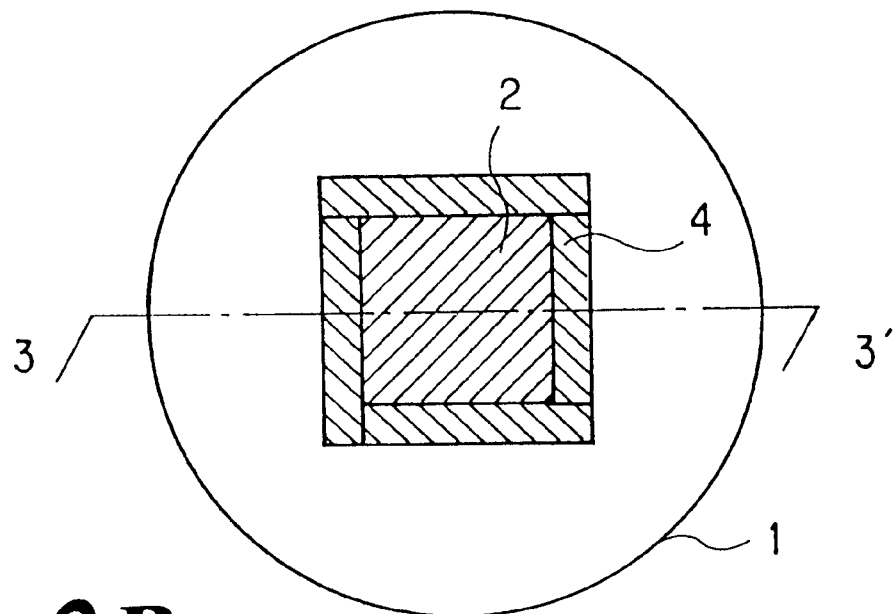
FIGS. 3(*a*) and 3(*b*) are a plan view according to a third embodiment of the present invention and a sectional view taken along line 3–3' in FIG. 3(*a*)
Figure 3B:
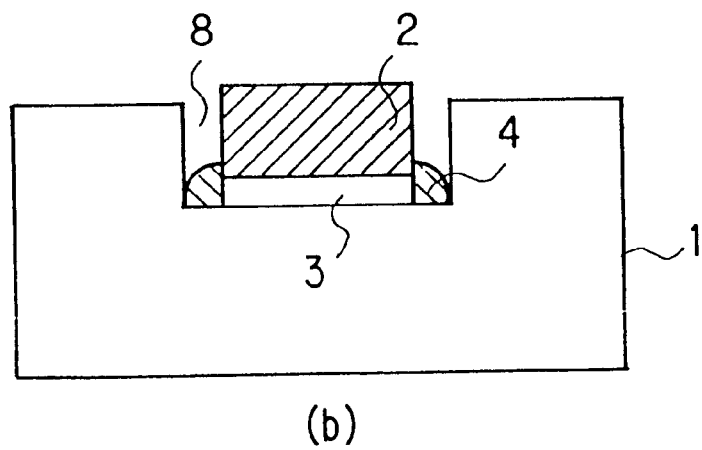
Figure 4:
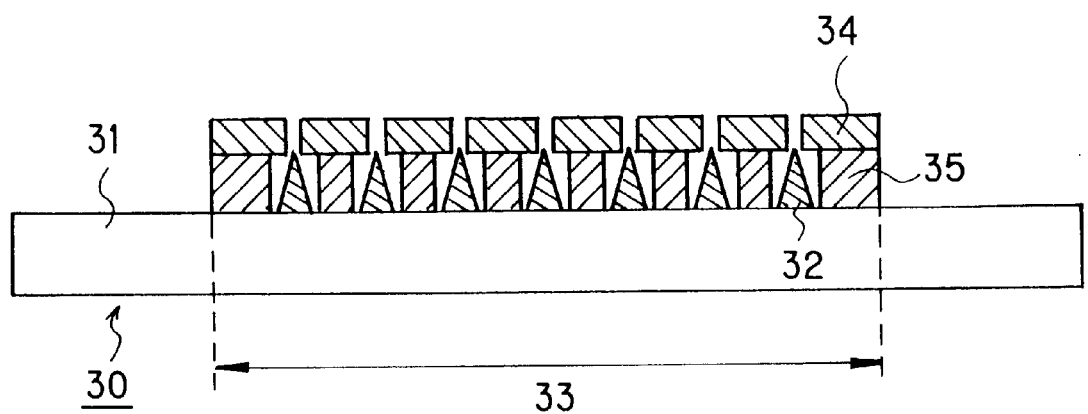
FIG. 4 is a sectional view showing such an electric field electron emission cathode.
Figure 6A:
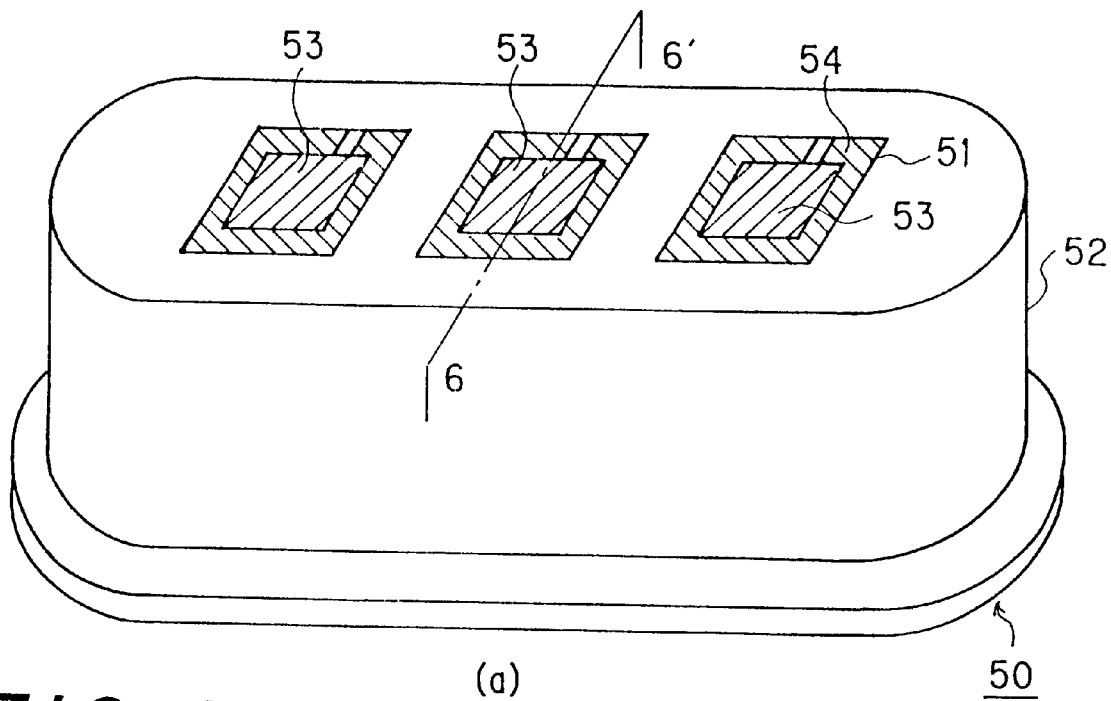
FIGS. 6(*a*) and 6(*b*) are a perspective view showing prior cathode structure and a sectional view taken along line 6–6'.
Figure 6B:
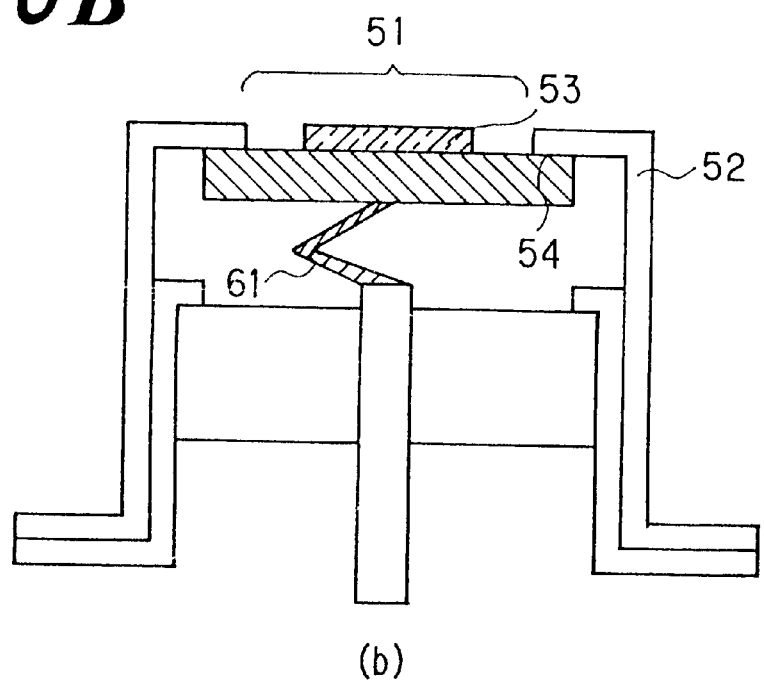

FIGS. 3(*a*) and 3(*b*) show a third embodiment of the present invention. FIG. 3(*a*) is a plan view, and FIG. 3(*b*) is a sectional view taken along line 3–3' in FIG. 3(*a*). In this base, a base plate 1 with a recess formed therein is used. A cold cathode 2 is secured in the recess with a solder material 3, and a groove 8 thus formed is filled with an inorganic adhesive 4.

In the above first to third embodiments the gold/silicon eutectic alloy was used, it is possible to use conductive pastes as well. When using a thermo-setting conductive paste, however, its hardening temperature should be higher than the hardening temperature of the inorganic adhesive. Also, its plasticization temperature should be higher than the hardening temperature of the inorganic adhesive.

As an alternative to the bonding process, it is possible to mount the cold cathode by a gold-to-gold bonding with a gold film formed on the lower surface of the cold cathode and the raised portion of the base plate. In the case of the gold-to-gold bonding, a bonding temperature of around 300° C. and a bonding pressure of 1 to 10 kg/cm$^2$ are necessary. The inorganic adhesive may be the same because of a higher bonding temperature than its hardening temperature.

As has been described in the foregoing, according to the present invention an inorganic adhesive which is hardened at a lower temperature than the hardening temperature when mounting the cold cathode, is used to secure the cold cathode in position, and it is thus possible to secure the cold cathode in position without position accuracy deterioration. In addition, the cold cathode position is not deviated even in a high temperature process of glass sealing an electron gun with cold cathodes in a cathode-ray tube.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed:

1. A method of securing a semiconductor chip to a base plate comprising the steps in sequence of:
   (A) mounting the body of the semiconductor chip to the base plate using a first mounting material heated to its melting or fusing temperature;
   (B) cooling the mounted chip from step A to below the melting or fusing temperature of said first mounting material;
   (C) securing the periphery of the semiconductor chip to the base plate using an inorganic adhesive having a hardening temperature lower than the hardening temperature of the first mounting material heated to the hardening temperature of said inorganic adhesive; and
   (D) cooling the mounted chip from step (C).

2. The securing method of claim 1, wherein the semiconductor chip is secured to the base plate at at least six points on its periphery.

3. The securing method of claim 1, wherein the semiconductor chip is mounted on a recess formed on the base plate using the first mounting material.

4. The securing method of claim 1, wherein said first mounting material comprises a gold/silicon eutectic alloy.

5. The securing method of claim 1, wherein said first mounting material comprises a gold-to-gold bonding material with a gold film formed on the lower surface of the semiconductor chip and the upper surface of the base plate.

6. The securing method of claim 1, wherein said first mounting material comprises a conductive paste.

7. The securing method claim 1, wherein said first mounting material comprises a thermo-setting conductive paste having a hardening temperature higher than the hardening temperature of the inorganic adhesive and a plasticization temperature higher than the hardening temperature of the inorganic adhesive.

8. The securing method of claim 1, wherein said semiconductor chip includes field electron emission cold cathodes.

9. A method of securing an electric field electron emission cold cathode comprising an emitter section having a large number of micro-projections of a conductive material formed on a conductive substrate via an insulating film, the electric field electron emission cold cathode being electrically connected to and secured to the conductive base plate, the method comprising the steps in sequence of:(A) mounting the body of an electric field electron emission cold cathode to the base plate at a predetermined position thereof using a first mounting material heated to its melting or fusing temperature; (B) cooling the mounted chip from step (A) to below the melting or fusing temperature of said first mounting material; (C) securing, the periphery of the electric field electron emission cold cathode to the conductive base plate using an inorganic adhesive having a hardening temperature lower than the hardening temperature of the mounting material heated to the hardening point of said inorganic adhesive; and (D) cooling the mounted electric field electron emission cold cathode from step (C).

* * * * *